United States Patent
Hollatz

(10) Patent No.: US 7,326,612 B2
(45) Date of Patent: Feb. 5, 2008

(54) METHOD FOR FABRICATING A SEMICONDUCTOR STRUCTURE

(75) Inventor: Mark Hollatz, Neustadt (DE)

(73) Assignee: Qimonda AG, Munich (DE)

( * ) Notice: Subject to any disclaimer, the term of this patent is extended or adjusted under 35 U.S.C. 154(b) by 274 days.

(21) Appl. No.: 11/256,676

(22) Filed: Oct. 21, 2005

(65) Prior Publication Data

US 2006/0110872 A1   May 25, 2006

(30) Foreign Application Priority Data

Oct. 22, 2004   (DE) .................. 10 2004 052 141

(51) Int. Cl.
*H01L 21/8242* (2006.01)
(52) U.S. Cl. .................. 438/243; 438/246; 438/386; 438/389; 438/268; 257/E29.346
(58) Field of Classification Search ........ 438/268–270, 438/243, 246, 386, 389
See application file for complete search history.

(56) References Cited

U.S. PATENT DOCUMENTS

| 5,943,582 | A | * | 8/1999 | Huang et al. ............... 438/396 |
| 6,143,599 | A |   | 11/2000 | Kim et al. |
| 6,459,112 | B1 | * | 10/2002 | Tsuboi et al. ............... 257/296 |
| 6,762,110 | B1 | * | 7/2004 | Masuda .................... 438/396 |
| 2001/0039113 | A1 | * | 11/2001 | Blalock et al. ............ 438/629 |
| 2003/0201481 | A1 |   | 10/2003 | Heo et al. |
| 2004/0159909 | A1 | * | 8/2004 | Kim et al. .................. 257/532 |

FOREIGN PATENT DOCUMENTS

DE   103 21 494 A1   12/2004

\* cited by examiner

*Primary Examiner*—Thanh Nguyen
(74) *Attorney, Agent, or Firm*—Slater & Matsil, L.L.P.

(57) ABSTRACT

A method is provided for fabricating a semiconductor structure, such as a DRAM memory cell, that includes an elevated region with at least one sidewall. The at least one sidewall is provided with an insulation layer. A mask layer is applied to the insulation layer. The mask layer is patterned in such a way that it is removed from the surface of the elevated region and from an edge region of the insulation layer, said edge region adjoining the sidewall of the elevated region. A material is implanted into the surface of the elevated region and also into the edge region of the insulation layer. The material preferably alters the properties of the surface of the elevated region and also increases the etching rate of the insulation layer. The mask layer is removed and the insulation layer is subjected to a whole-area etching step.

20 Claims, 9 Drawing Sheets

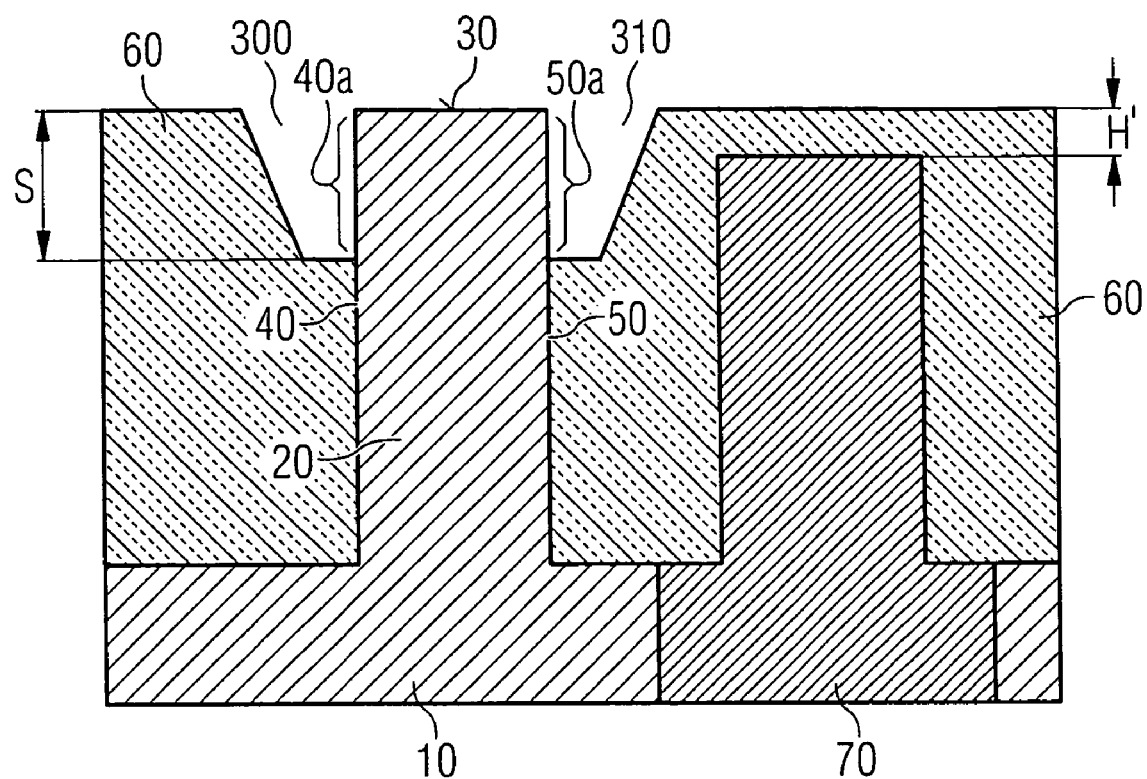

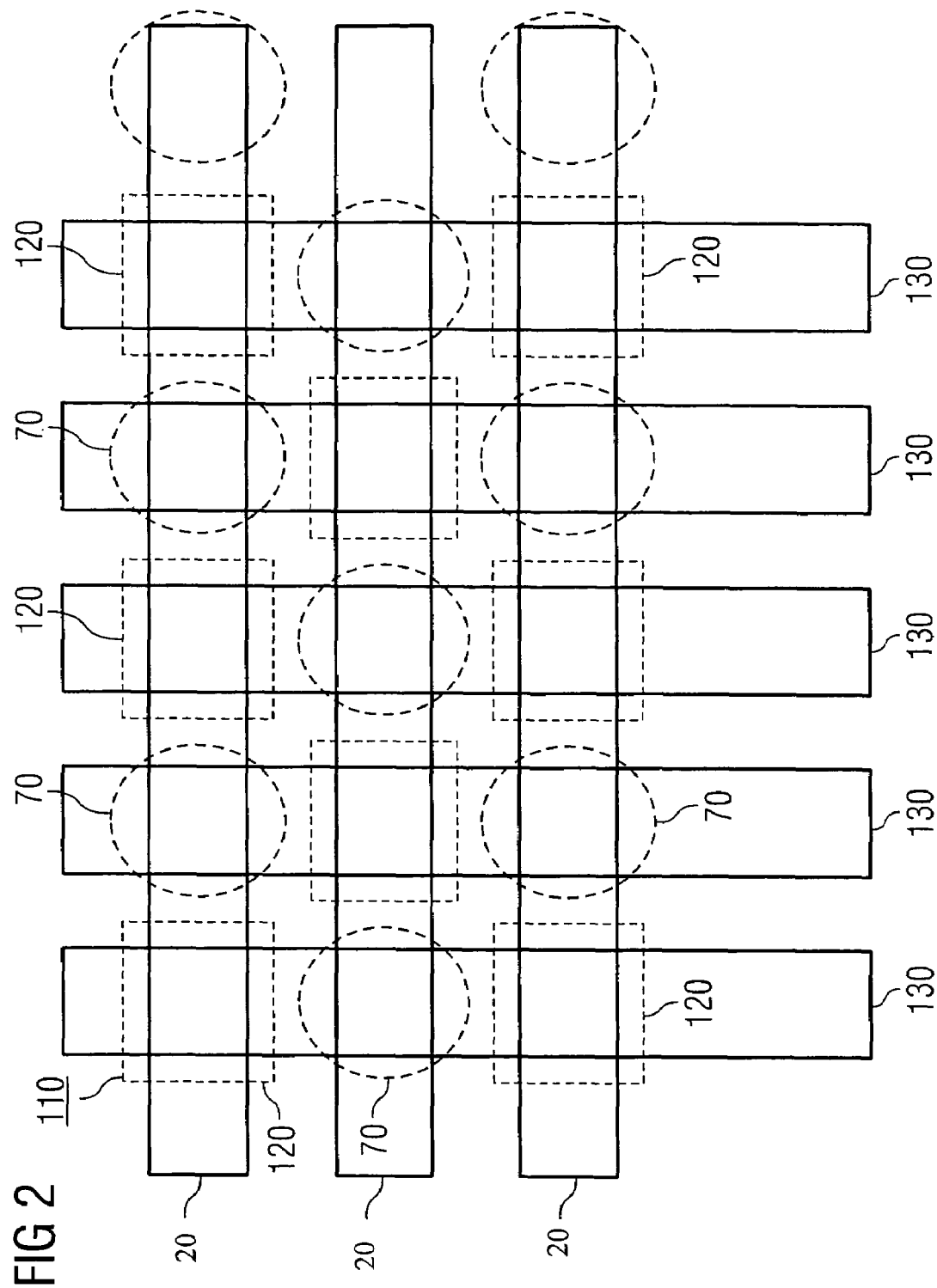

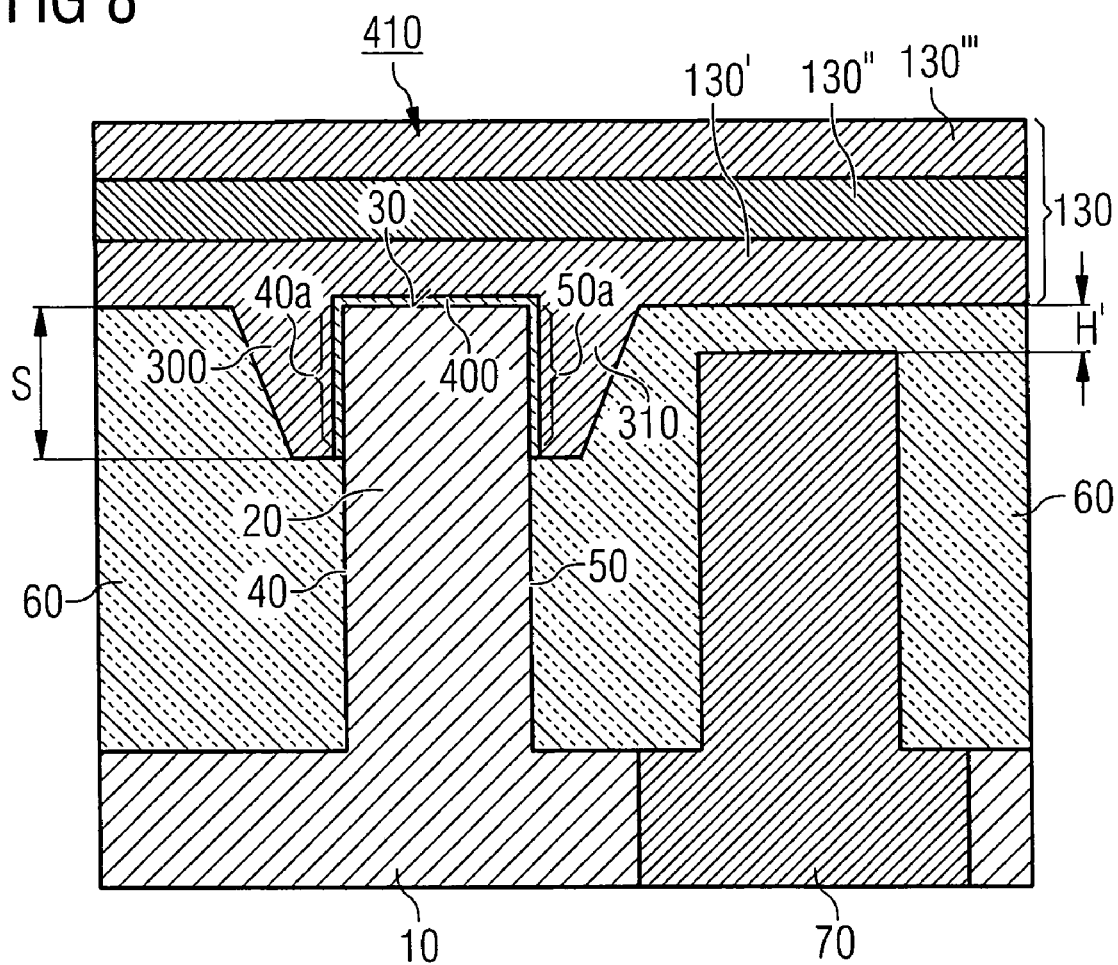

METHOD FOR FABRICATING A SEMICONDUCTOR STRUCTURE

This application claims priority to German Patent Application 10 2004 052 141.7 which was filed Oct. 22, 2004, and is incorporated herein by reference.

TECHNICAL FIELD

The invention relates to a method for fabricating a semiconductor structure, for example, for a DRAM memory cell, in which an elevated region with at least one sidewall is fabricated in the context of the fabrication method.

BACKGROUND

Such a method is disclosed for example in the published US Patent Application Publication No. 2003/0201481 A1, and is used for fabricating a DRAM memory cell. In this previously known method, firstly a capacitor as passive component is integrated into a silicon substrate. The capacitor is a so-called deep trench capacitor. An elevated silicon region having a surface and sidewalls adjoining the latter is formed directly alongside the capacitor. A field effect transistor is formed in the region of the surface of the elevated region and also at a sidewall of the elevated region that faces the deep trench capacitor, the gate region of the field effect transistor being arranged at the sidewall of the elevated region. For the purpose of covering the capacitor and for insulating the capacitor from an electrical drive line of the DRAM memory cell, the capacitor is insulated by means of an insulation layer, namely an STI layer (STI: Shallow Trench Insulation).

SUMMARY OF THE INVENTION

In one aspect, the invention specifies a method for processing a semiconductor structure that makes it possible to prepare an elevated region of the semiconductor structure as simply as possible and with the fewest possible process steps for a subsequent "construction" of an electrical component, for example, a transistor. The elevated region is intended, in particular, to be prepared as well as possible for a subsequent construction of a field effect transistor, for example, for a DRAM memory cell or a DRAM memory cell array.

Accordingly, according to embodiments of the invention, it is provided that an insulation layer is applied to the at least one sidewall of the elevated region. A mask layer is subsequently arranged on the insulation layer and patterned, the mask layer being removed on the surface of the elevated region and also in an edge region of the insulation layer, the edge region directly adjoining the sidewall of the elevated region. Afterward, a material is implanted into the surface of the elevated region and also into the edge region of the insulation layer, which material alters the properties of the surface of the elevated region and also increases the etching rate of the insulation layer. The mask layer is subsequently removed, and the insulation layer is subjected to a whole-area etching step.

One essential advantage of the method according to certain embodiments of the invention is that both the surface of the elevated region and the properties of the insulation layer surrounding the elevated region are altered by means of very few process steps.

By virtue of the fact that implantation is effected into the surface of the elevated region, it is possible to alter the surface properties thereof. By way of example, it is thus possible to prepare for a subsequent deposition of further materials on the surface, e.g., of a gate oxide for a field effect transistor.

By virtue of the fact that the implantation step increases the etching rate of the insulation layer directly in the edge region with respect to the sidewall of the elevated region, a step is formed in the insulation layer during the subsequent whole-area etching step. By virtue of that step, by way of example, that section of the sidewall that directly adjoins the surface of the elevated region can be freed of the insulation layer. This simplifies for example the subsequent process implementation when processing the surface of the elevated structure.

The combination of the above-mentioned method steps thus makes it possible simultaneously to achieve a total of three "effects", namely (firstly) an alteration of the surface of the elevated region, (secondly) an uncovering of that section of the sidewall of the elevated region that adjoins the surface of the elevated region, and (thirdly) the formation of a step in the insulation layer.

Preferably, an etched step is formed in the context of the whole-area etching step in such a way that the thickness of the insulation layer decreases in the direction of the sidewall. A "negative" surface gradient of the insulation layer in the direction of the elevated region is thus formed.

Particularly preferably, nitrogen is implanted in the context of the implantation step. This is because nitrogen has the advantage that it alters the surface of the elevated region in such a way that an oxide layer (gate oxide layer) having particularly good properties, in particular having a predetermined, suitable oxide growth rate and, accompanying this, having a predetermined resulting oxide thickness, can subsequently be applied to the surface, for example, for forming a field effect transistor.

Accordingly, it is additionally regarded as advantageous if the elevated region is an "active" region, preferably an "active" silicon region, to which an active electrical element is applied after the conclusion of the whole-area etching step. As already mentioned, a transistor, in particular a field effect transistor, may be placed as an active electrical element onto the surface of the elevated region.

In the case of fabricating a field effect transistor on the surface of the elevated region, it is regarded as advantageous if a gate insulation layer is applied to the surface of the elevated region and an electrically conductive gate connection layer is applied to the gate insulation layer. Preferably, the nitrogen implantation dose is chosen in such a way as to achieve a predetermined growth or deposition behavior of the gate insulation layer on the elevated region. By way of example, an implantation dose in the range of between $1*10^{13}$ cm$^{-2}$ and $1*10^{17}$ cm$^{-2}$, preferably in the region of a few $10^{14}$ cm$^{-2}$, is used.

By way of example, a gate oxide may be grown as the gate insulation layer on the surface of the elevated region. As an alternative, a nitrided oxide or a nitride may also be deposited or grown as gate insulation layer.

The method according to embodiments of the invention may be used for example in the context of a fabrication method for memory elements, in particular for DRAM memory elements.

By way of example, an oxide layer, preferably an STI layer (STI: shallow trench isolation), may be applied as the insulation layer to the sidewalls of the elevated region.

In order to be able to influence and shape the step in the insulation layer in the transition region to the elevated structure in an even more targeted fashion, it is regarded as advantageous if an additional etching step is carried out before the removal of the mask layer. This additional etching step may be effected before or after the implantation step and be carried out in wet-chemical fashion or in dry-chemical fashion.

BRIEF DESCRIPTION OF THE DRAWINGS

The invention is explained below on the basis of exemplary embodiments, in this case:

FIGS. 1A-1C show a semiconductor structure on the basis of which a first exemplary embodiment of the method according to the invention is explained by way of example;

FIG. 2 shows a mask for processing the semiconductor structure in accordance with FIGS. 1A to 1C;

FIG. 8 shows the structure in accordance with FIG. 3 in cross section.

The following list of reference symbols can be used in conjunction with the figures:

| | |
|---|---|
| 10 | Semiconductor substrate |
| 20 | Elevated region |
| 30 | Surface |
| 40 | Sidewall |
| 40a | Upper sidewall section |
| 50 | Sidewall |
| 50a | Upper sidewall section |
| 60 | Insulation layer |
| 70 | Deep trench capacitor |
| 100 | Mask layer |
| 110 | Exposure mask |
| 120 | Opening holes |
| 130 | Interconnects |
| 200 | Edge region |
| 210 | Edge region |
| B | Width of the elevated region |
| a | Width of the edge region |
| H, H' | Thickness H of the insulation layer |
| 300 | Etched step |
| 310 | Etched step |
| 400 | Gate oxide |
| 410 | Transistors |

DETAILED DESCRIPTION OF ILLUSTRATIVE EMBODIMENTS

Figure 1A:
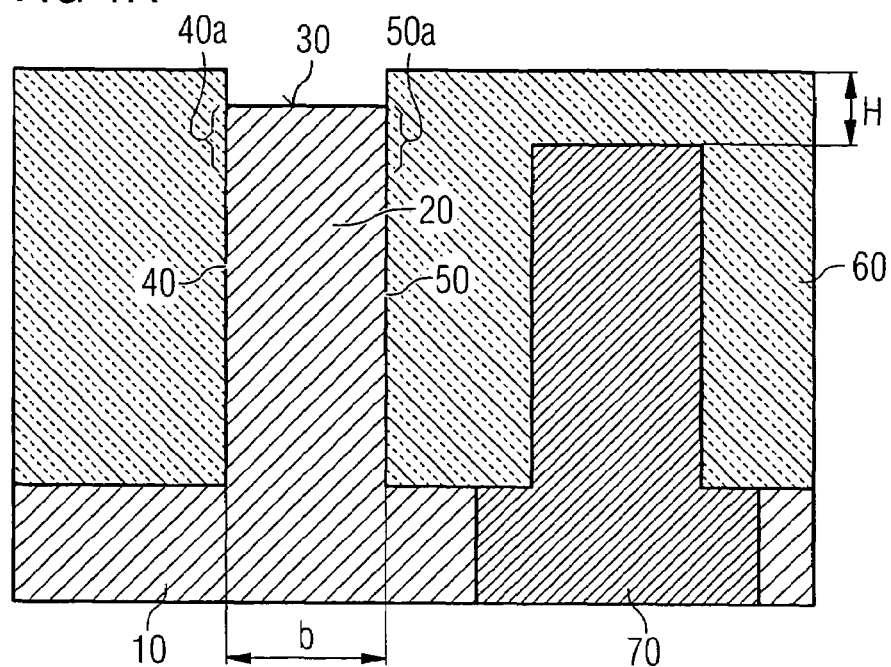

FIG. 1A illustrates a semiconductor substrate 10, which is composed of silicon, for example. The semiconductor substrate 10 has an elevated region 20, on the surface 30 of which a field effect transistor will be applied as an active electrical element in subsequent process steps. The elevated region 20 thus forms an active region of the semiconductor substrate 10.

The elevated region 20 furthermore has two sidewalls 40 and 50 covered with an insulation layer 60, for example, an oxide layer. The insulation layer 60 furthermore covers a deep trench capacitor 70 integrated in the semiconductor substrate 10. The deep trench capacitor 70 forms a passive element of the semiconductor structure illustrated in FIG. 1A.

For the further processing of the semiconductor structure illustrated in FIG. 1A, nitrogen is to be implanted into the surface 30 of the elevated region 20. This step of nitrogen implantation into the surface 30 of the elevated structure 20 serves for altering the properties of the surface 30 in such a way that the field effect transistor already mentioned can be "constructed" with predetermined electrical properties on the surface. In other words, what is achieved by the implantation of nitrogen into the surface 30 is that a gate oxide of the future field effect transistor having very good electrical and also good mechanical properties can be applied on the surface, because, inter alia, the oxide growth rate and thus the gate oxide thickness can be set by means of the implantation. In other words, the implantation of nitrogen into the surface 30 of the elevated region 20 thus serves for preparing or enabling the further construction of a field effect transistor on the surface 30.

In connection with the fabrication of active electrical elements on the surface of elevated regions, the applicant has established that it is advantageous if the upper regions or sections 40a and 50a of the sidewalls 40 and 50, which adjoin the surface 30 are freed of the insulation layer 60 before the further construction of the field effect transistor is effected on the surface 30 of the elevated region 20. The uncovering of the upper section 40a of the sidewall 40, which adjoins the surface 30, and of the corresponding upper section 50a of the sidewall 50, could be achieved, then, for example by the insulation layer 60 being thinned or etched "thinner" over the whole area. However, the disadvantage of such a procedure would be that the thickness H of the insulation layer 60 above the deep trench capacitor 70 would decrease greatly, thereby impairing or destroying the insulation of the capacitor 70 "toward the top".

Figure 1B:
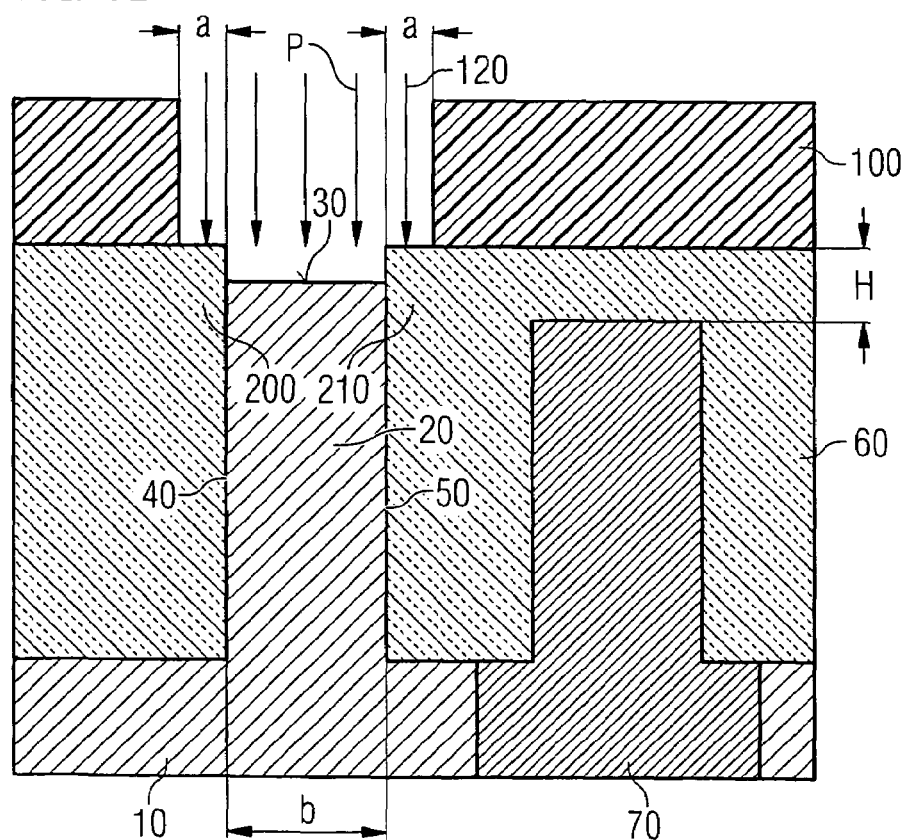

In order, then, to achieve the effect that the upper regions 40a and 50a of the two sidewalls 40 and 50 can be freed of the insulation layer 60 without the height H of the insulation layer 60 above the deep trench capacitor 70 decreasing too much, firstly—as illustrated in FIG. 1B—a mask layer 100, for example a photoresist layer or a hard mask layer (e.g., oxide or nitride layer), is applied to the insulation layer 60. The mask layer 100 is subsequently patterned using an exposure mask.

The exposure mask 110 is shown by way of example in FIG. 2. The exposure mask 110 has opening holes 120, which are arranged for example symmetrically in the form of an array if a memory array comprising a multiplicity of DRAM memory cells is intended to be formed in the substrate 10. For the sake of better understanding, FIG. 2 additionally depicts the deep trench capacitors 70 and the elevated regions 20 of the DRAM memory cells of the memory array that are to be fabricated, in order to illustrate the relative position of the opening holes 120. Also evident is the position of future interconnects 130 used to make contact with the transistors to be fabricated on the elevated regions 20. It can be discerned that the interconnects 130 pass the deep trench capacitors 70. In order to prevent an electrical contact between the deep trench capacitors 70 and the interconnects 130, the thickness H of the insulation layer 60 illustrated in FIGS. 1A and 1B must, therefore, be sufficiently large and also remain large in the further process sequence.

After the patterning of the mask layer 100 using the exposure mask 110, the opening hole 120 shown in FIG. 1B is thus present in the mask layer 100, through which hole the nitrogen atoms are implanted both into the surface 30 of the elevated region 20 and into edge regions 200 and 210 of the insulation layer 60. This is indicated schematically by arrows P in FIG. 1B. The two edge regions 200 and 210 directly adjoin the assigned sidewalls 40 and 50 of the elevated region 20. In order to ensure such an implantation, the width B of the opening holes 120 in the mask layer 100 is chosen in such a way that the following holds true:

$$B=b+2a,$$

where b designates the width of the elevated region 20 and a designates the width of the respective edge region of the insulation layer 60.

After the implantation step has been carried out, the mask layer 100 is removed over the whole area, and the resulting structure is subjected to a whole-area etching step. On account of this whole-area etching step, the thickness H of the insulation layer 60 situated above the deep trench capacitor 70 will decrease slightly, so that the following holds true (see FIG. 1C):

$$H'<H.$$

On account of the implantation of nitrogen ions into the two edge regions 200 and 210 of the insulation layer 60, the etching rate is significantly increased in these regions, so that the insulation layer 60 is etched significantly faster and thus deeper in the region of the edge regions 200 and 210. Etched steps 300 and 310 thus arise, which are formed in such a way that the thickness of the insulation layer 60 decreases in the direction of the two sidewalls 40 and 50. What is thus achieved as a result is that the upper regions 40a and 50a of the two sidewalls 40 and 50, which adjoin the surface 30 are freed of the insulation layer 60 without the thickness H of the insulation layer 60 being correspondingly reduced. A sufficiently thick insulation layer, which isolates the deep trench capacitors 70 from the interconnects 130 (see FIG. 2), thus remains above the deep trench capacitors 70.

The customary step height S of the etched steps 300 and 310 is preferably of the order of magnitude of between S=10 nm and S=100 nm.

After the whole-area etching step has been carried out, a field effect transistor can then be constructed on the surface 30 of the elevated region 20. The field effect transistor can be connected to the deep trench capacitor 70 and form a DRAM cell with the latter. As already explained in connection with FIG. 2, DRAM cells of this type can be arranged closely adjacent alongside one another in the substrate 10 and form a memory cell array in the substrate 10. Such a memory cell array is shown by way of example in a three-dimensional illustration in FIG. 3.

Figure 3:
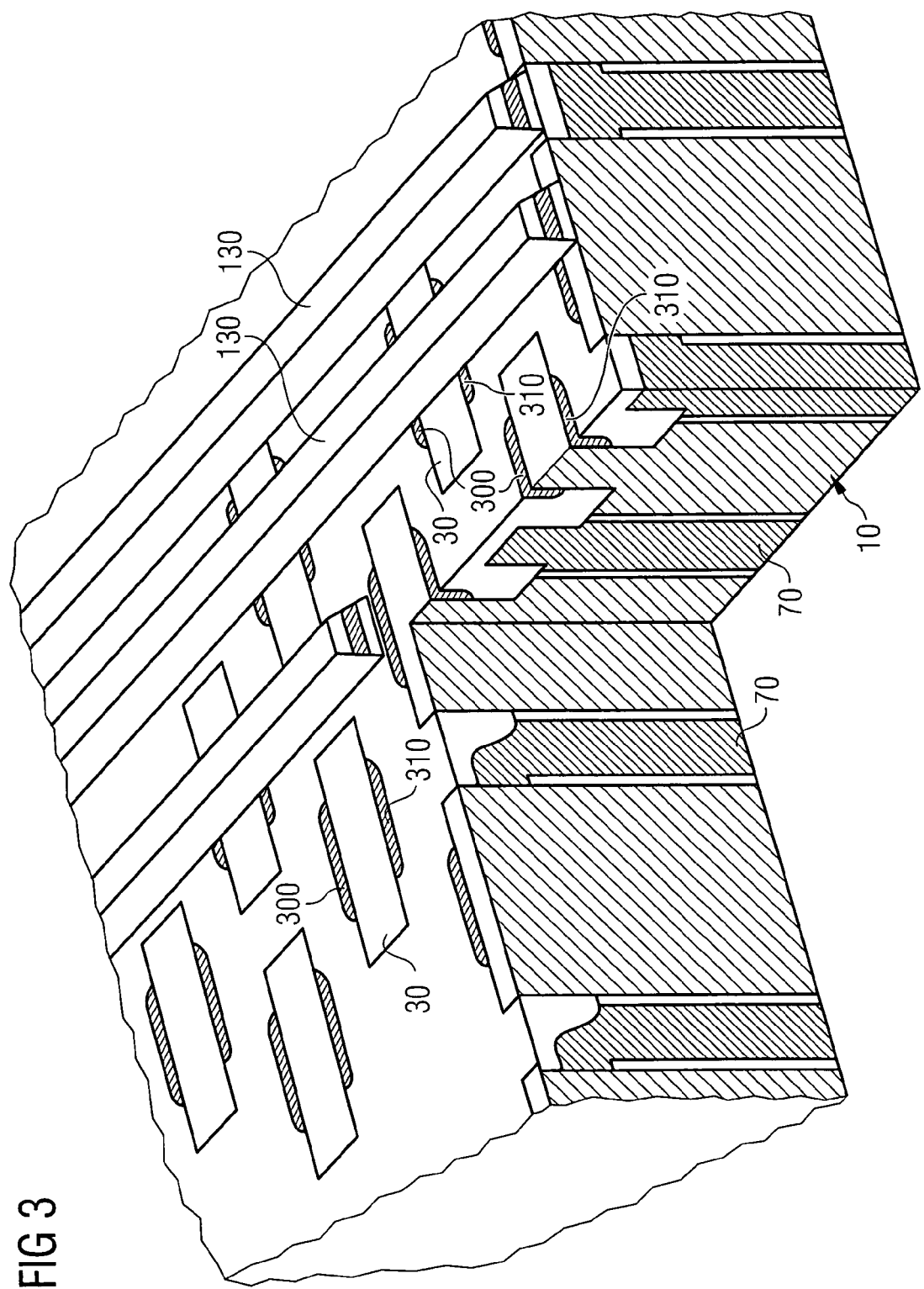
FIG. 3 shows the resulting semiconductor structure in accordance with FIG. 1C in a three-dimensional illustration.

FIG. 3 reveals the substrate 10 with the elevated regions 20 and also the steps 300 and 310. The deep trench capacitors 70 can additionally be discerned. FIG. 3 additionally depicts the interconnects 130, which are used to make contact with the transistors on the elevated regions 20 and which "pass" the deep trench capacitors 70 with no contact being made, because the residual thickness H' of the insulation layer 60 is still sufficiently large.

The position of the interconnects 130 on the transistors or on the elevated regions 20 is shown in more detail in cross section in FIG. 8. It can be seen that the gate oxide 400 of the transistors 410 is grown on the surface 30 and also on the regions 40a and 50a adjoining the latter. The interconnects 130 are dimensioned or measured in terms of their width and their thickness such that they completely fill the steps or trenches 300 and 310. The interconnects 130 are three-layered, for example, and comprise a lower layer 130' an intermediate layer 130" and an upper covering layer 130'''. The lower layer 130' settles into the trenches 300 and 310 and largely "planarizes" the latter. The intermediate layer 130" and the covering layer 130''' run "smoothly" or in planar fashion—as portrayed in FIG. 8. As an alternative, the intermediate layer 130" and the covering layer 130''' likewise "settle" into the trenches 300 and 310, depending on the thickness of the lower layer 130' and the degree of planarity with which the surface of the lower layer 130' is formed.

Figure 4A:
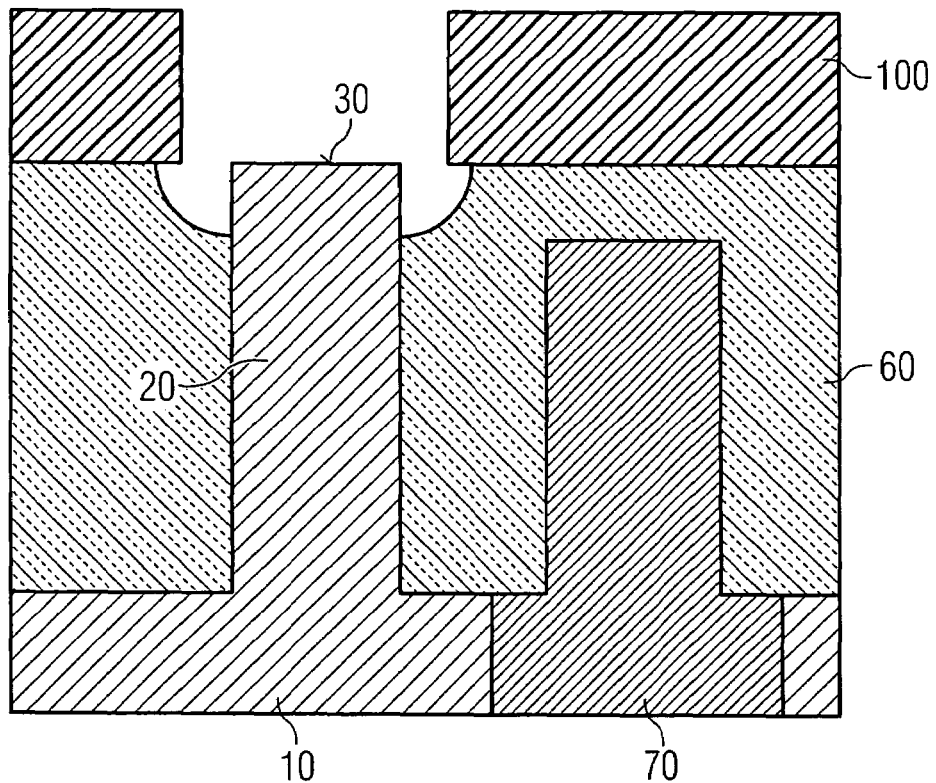
FIGS. 4A and 4B show a first variant of the method according to the invention.
Figure 4B:
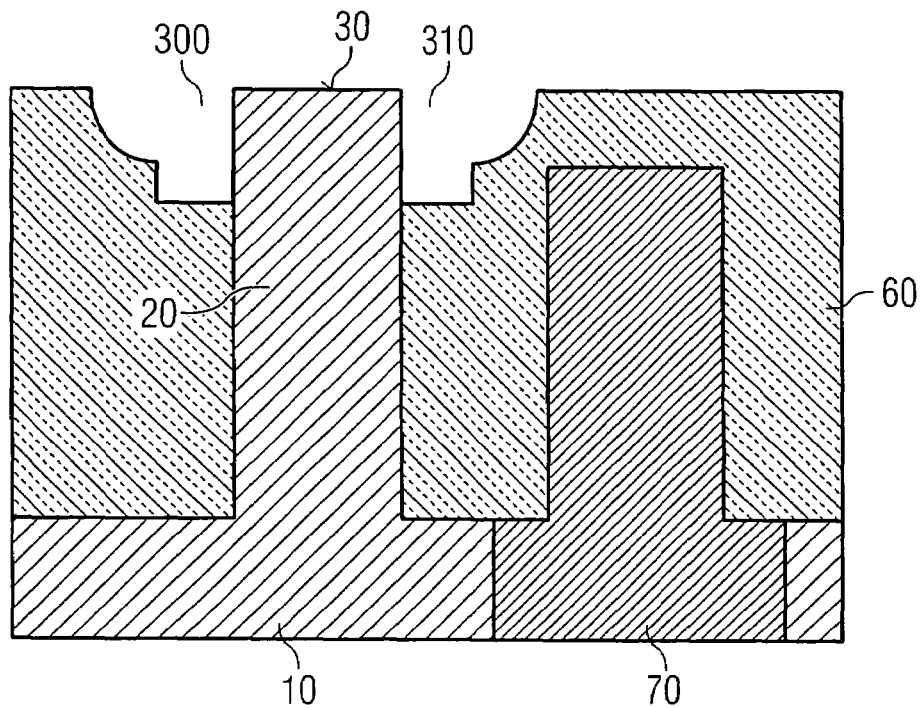

FIGS. 4A and 4B illustrate a first variant of the method described in connection with FIGS. 1A to 3. In the case of this first variant, after masking with the mask layer 100 and before carrying out the nitrogen implantation step, a wet-chemical etching is carried out (see FIG. 4A). Nitrogen is subsequently implanted into the resulting structure, and the mask layer 100 is removed. The whole-area etching step is then carried out, with the result that the structure illustrated in FIG. 4A is formed, in the case of which the shaping of the steps 300 and 310 is modified compared with the steps 300 and 310 in accordance with FIG. 1C.

Figure 5A:
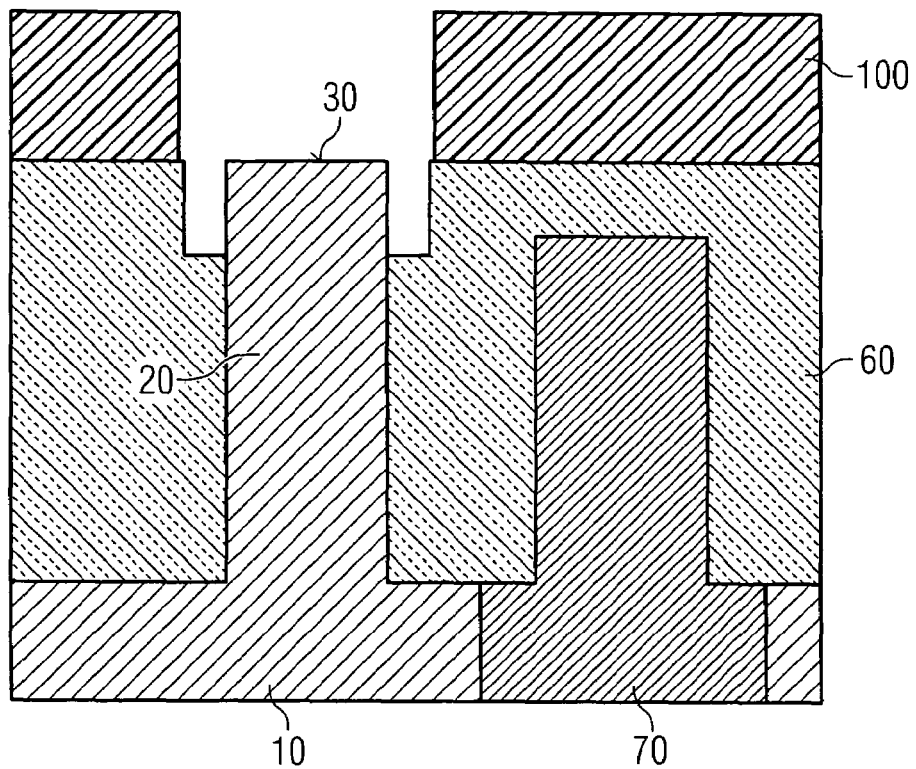
FIGS. 5A and 5B show a second variant of the method according to the invention.
Figure 5B:
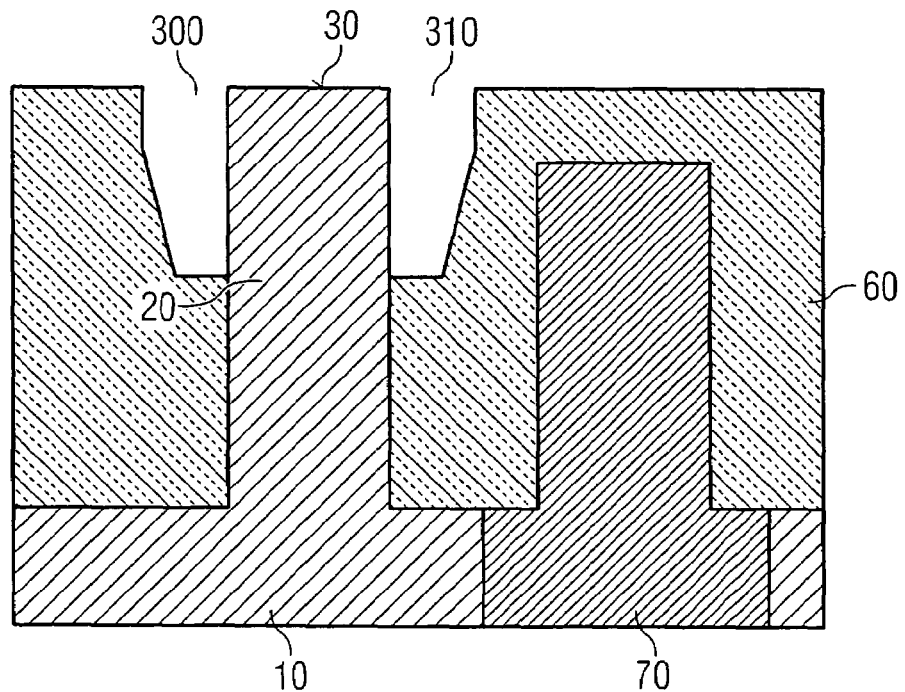

In the case of a second variant of the method, which is illustrated in FIGS. 5A and 5B, instead of the wet-chemical etching step described in connection with FIGS. 4A and 4B, a dry-etching step is carried out, to be precise before the nitrogen implantation is carried out. The step profile illustrated in FIG. 5B is produced.

Figure 6A:
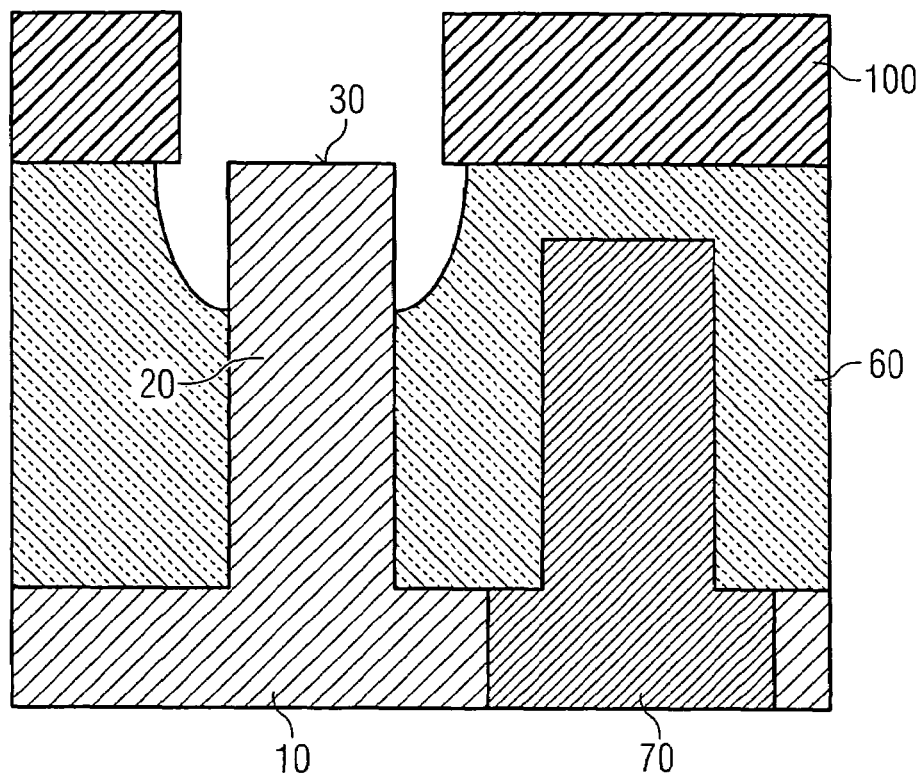
FIGS. 6A and 6B show a third variant of the method according to the invention.
Figure 6B:
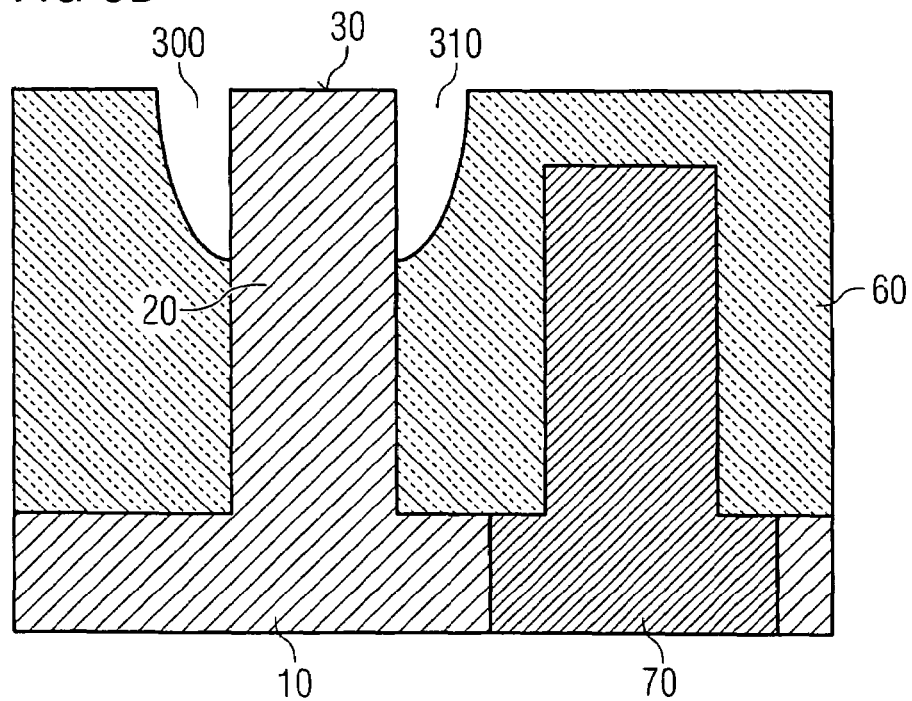

FIGS. 6A and 6B illustrate a third variant of the processing method. In the case of this third variant, after carrying out the nitrogen implantation step and before removing the mask layer 100, firstly an additional wet-chemical etching step is carried out, whereby the structure illustrated in FIG. 6A is formed. After removing the mask layer 100 and after carrying out the whole-area etching step, the result is the step profile of the steps 300 and 310 as illustrated in FIG. 6B.

Figure 7A:
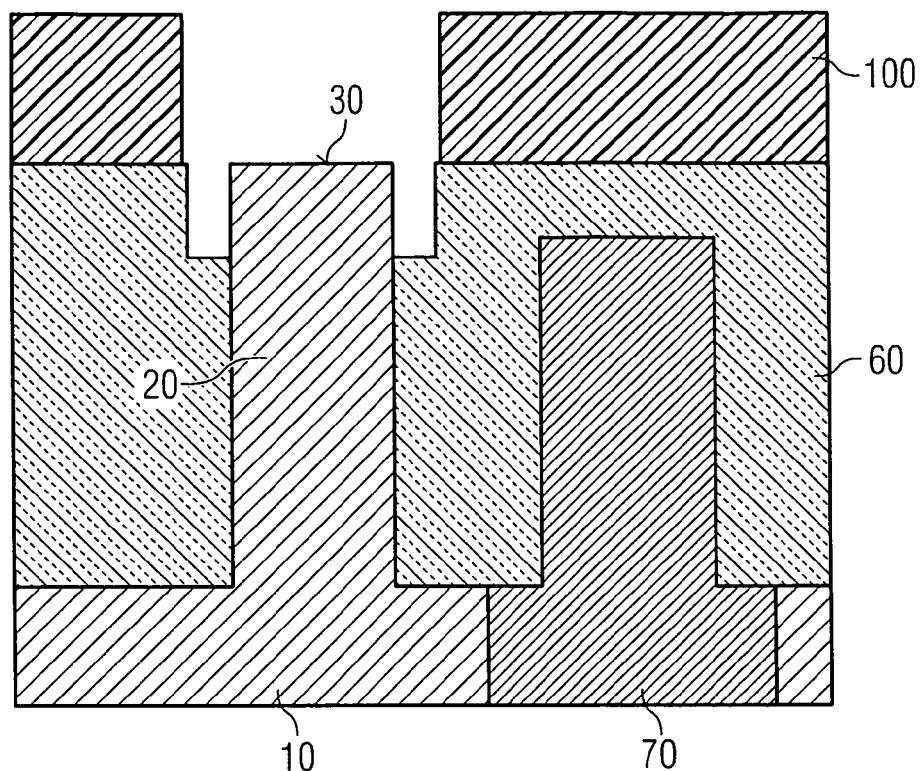
FIGS. 7A and 7B show a fourth variant of the method according to the invention.
Figure 7B:
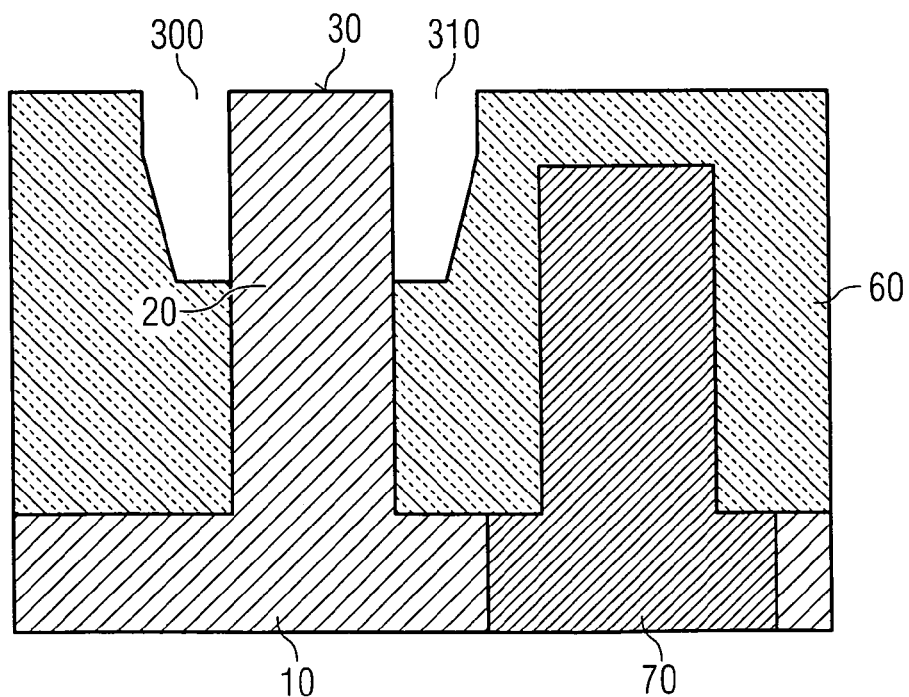

FIGS. 7A and 7B show a fourth variant of the fabrication method, in which a dry-etching step is carried out after carrying out the nitrogen implantation step and before removing the mask layer 100. FIG. 7A shows the resulting semiconductor structure in cross section.

After the removal of the mask layer 100 and after the whole-area etching of the insulation layer 60, the result is the semiconductor structure illustrated in FIG. 7B in cross section.

In the case of the transistors 410 shown in connection with FIGS. 3 and 8, the two sidewalls 40 and 50 are freed of the insulation layer 60 and provided with the respective transistor structure in their regions 40a and 50a adjoining the surface 30. As an alternative, it is also possible for only a single sidewall 40 or 50 to be correspondingly provided with the transistor structure, the respective other sidewall then remains untreated and covered by the insulation layer 60. This can be achieved by means of a corresponding dimensioning of the exposure mask 110.

Although the present invention and its advantages have been described in detail, it should be understood that various changes, substitutions and alterations can be made herein without departing from the spirit and scope of the invention as defined by the appended claims.

What is claimed is:

1. A method for fabricating a semiconductor structure, the method comprising:
   providing an elevated surface with at least one sidewall;
   forming an insulation layer adjacent the at least one sidewall;

applying a mask layer to the insulation layer;
patterning the mask layer in such a way that it is removed from a surface of the elevated region and from an edge region of the insulation layer, said edge region adjoining the sidewall of the elevated region;
implanting a material into the surface of the elevated region and also into the edge region of the insulation layer, wherein the material alters properties of the surface of the elevated region and also increases the etching rate of the insulation layer;
removing the mask layer; and
subjecting the insulation layer to a whole-area etching step.

2. The method according to claim 1, wherein subjecting the insulation layer to a whole-area etching step comprises forming an etched step in the edge region of the insulation layer.

3. The method according to claim 1, wherein implanting a material comprises implanting nitrogen.

4. The method according to claim 1, further comprising fabricating an electrical element before or after formation of the elevated region and also before the application of the insulation layer alongside the elevated region, wherein during the forming of the insulation layer, the electrical element is completely covered with the insulation layer.

5. The method according to claim 4, wherein the electrical element comprises a capacitor.

6. The method according to claim 5, wherein the electrical element comprises a deep trench capacitor.

7. The method according to claim 4, wherein subjecting the insulation layer to a whole-area etching step comprises performing the whole-area etching step in such a way that an upper section of the sidewall that adjoins the surface of the elevated region is freed of the insulation layer but the electrical element remains completely covered by the insulation layer.

8. The method according to claim 1, further comprising forming an active electrical element at the elevated region after completing the whole-area etching step.

9. The method according to claim 8, wherein forming an active electrical element comprises forming a field effect transistor.

10. The method according to claim 9, wherein the field effect transistor is formed by applying a gate insulation layer on the surface of the elevated region and forming an electrically conductive gate connection layer over said gate insulation layer.

11. The method according to claim 10, wherein implanting a material comprises implanting nitrogen and wherein a nitrogen implantation dose is chosen in such a way as to achieve a predetermined growth or deposition behavior of the gate insulation layer on the surface of the elevated region.

12. The method according to claim 11, wherein applying a gate insulation layer comprises growing a gate oxide on the elevated region.

13. The method according to claim 1, further comprising forming a DRAM memory element that includes a capacitor and a transistor.

14. The method according to claim 1, wherein the insulation layer comprises an oxide layer.

15. The method according to claim 1, wherein the insulation layer is a portion of a shallow trench isolation layer.

16. The method according to claim 1, further comprising carrying out an additional etching step before the removing the mask layer.

17. The method according to claim 16, wherein the additional etching step is carried out before the implantation step.

18. The method according to claim 16, wherein the additional etching step is carried out after the implantation step.

19. The method according to claim 16, wherein the additional etching step comprises a wet-chemical etching step.

20. The method according to claim 16, wherein the additional etching step comprises a dry-chemical etching step.

* * * * *